(12) United States Patent
Wang

(10) Patent No.: US 8,339,545 B2
(45) Date of Patent: Dec. 25, 2012

(54) TFT-LCD ARRAY SUBSTRATE AND METHOD OF MANUFACTURING THE SAME

(75) Inventor: Zheng Wang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 317 days.

(21) Appl. No.: 12/724,572

(22) Filed: Mar. 16, 2010

(65) Prior Publication Data
US 2010/0231834 A1    Sep. 16, 2010

(30) Foreign Application Priority Data
Mar. 16, 2009    (CN) .......................... 2009 1 0080225

(51) Int. Cl.
*G02F 1/1335*    (2006.01)

(52) U.S. Cl. ........................................ 349/110; 349/111
(58) Field of Classification Search .................. 349/114, 349/110–111, 192
See application file for complete search history.

(56) References Cited

U.S. PATENT DOCUMENTS
6,567,136 B1    5/2003    Sakuramoto et al.

*Primary Examiner* — Phu Vu
(74) *Attorney, Agent, or Firm* — Ladas & Parry LLP

(57) ABSTRACT

A thin film transistor liquid crystal display (TFT-LCD) array substrate, comprising a plurality of gate lines and a plurality of data lines formed on a substrate. The gate lines and the data lines define a plurality of pixel regions, and, in each of the pixel regions, a pixel electrode, a thin film transistor and a first light blocking bar are formed, and a second light blocking bar is formed over the first light blocking bar.

20 Claims, 8 Drawing Sheets

A1-A1

B1-B1

D1-D1

TFT-LCD ARRAY SUBSTRATE AND METHOD OF MANUFACTURING THE SAME

BACKGROUND

The present invention relates to a thin film transistor liquid crystal display (TFT-LCD) and a method of manufacturing the same.

Recently, as digital televisions are widely used, conventional CRT displays are gradually displaced by a new generation of displays because CRT displays have disadvantages of large volume, large weight, radiation and difficulty in digital application, etc. The representative new generation of displays includes plasma display panel (PDP), organic light-emitting display (OLED), liquid crystal display (LCD), etc. Among them, thin film transistor liquid crystal displays (TFT-LCDs) have advantages, such as, small volume, small weight, low power consumption, non-radiation, high display resolution, etc., and have gradually become the mainstream products in the display market.

The main configuration of a TFT-LCD includes an array substrate and a color filter substrate facing each other with a liquid crystal layer interposed therebetween. A plurality of gate lines, a plurality of data lines are formed on the array substrate and thin film transistors (TFTs) and pixel electrodes are arranged in an array defined by the gate lines and data lines on the array substrate. A counter electrode, color filters and the like are formed on the color filter substrate. Signals over the data lines are transmitted to the corresponding pixel electrodes under the control of the signals applied over the gate lines, and thereby the TFT-LCD can display desired images by generating electric fields between the pixel electrodes on the array substrate and the counter electrode on the color filter substrate so as to control the alignment of liquid crystal.

Since the manufacturing process of a TFT-LCD is very complicated, the display quality of a manufactured TFT-LCD may be seriously influenced when the manufacturing parameters deviate from the design requirements. For example, in manufacturing the array substrate of a TFT-LCD, light blocking bars are simultaneously formed when the gate lines of the array substrate are formed, and each of the light blocking bars is disposed at the periphery of a pixel electrode to prevent light from leaking therefrom; furthermore, a common voltage may be applied to the light blocking bars so that the light blocking bars can serve as common electrodes. In such a conventional pixel structure, parasitic capacitance is formed between a pixel electrode and a corresponding data line with a passivation layer disposed therebetween. Thus, when the TFTs as switching elements are turned on by the gate lines, the date lines begin to perform charge on the respective pixel electrodes through the TFTs. All of the pixel electrodes connected with each data line are influenced by the charging voltage on the data line with the parasitic capacitance, so the display voltages of these pixel electrodes may vary slightly and correspondingly, and image sticking may be generated along the direction of the data line on the display screen. Furthermore, in such a pixel structure, a black matrix is formed around and above the pixel electrodes in order to protect the devices provided in the liquid crystal panel from being influenced by exterior light. Light leakage phenomenon may not occur around the pixel electrodes due to the light blocking bars when the liquid crystal display panel is viewed from the front direction. But, when the liquid crystal display panel is viewed from an oblique direction, the light leakage phenomenon may be serious compared with the front direction.

SUMMARY

An embodiment of the present invention provides a thin film transistor liquid crystal display (TFT-LCD) array substrate, comprising a plurality of gate lines and a plurality of data lines formed on a substrate. The gate lines and the data lines define a plurality of pixel regions, and, in each of the pixel regions, a pixel electrode, a thin film transistor and a first light blocking bar are formed, and a second light blocking bar is formed over the first light blocking bar.

Another embodiment of the present invention provides a method for manufacturing a thin film transistor liquid crystal display (TFT-LCD) array substrate comprising a plurality of pixel regions, the method comprising: step 1 of forming a gate metal thin film on a substrate and forming a gate line, a gate electrode, and a first light blocking bar are formed for each pixel region by patterning; step 2 of forming a gate insulation layer, a semiconductor thin film, a doped semiconductor thin film and a source drain metal thin film on the resultant substrate obtained after step 1, an island-like active layer, a data line, a drain electrode, a source electrode, a thin film transistor (TFT) channel region and a second light blocking bar are formed for the pixel region by patterning, wherein the second light blocking bar is disposed over the first light blocking bar, and the gate line and the data line define the respective pixel region; step 3 of forming a passivation layer on the resultant substrate obtained after step 2 and a passivation layer through hole are formed for the pixel region by patterning; and step 4 of forming a transparent conductive thin film on the resultant substrate obtained after step 3, and a pixel electrode is formed for the pixel region by patterning, wherein the pixel electrode is connected with the drain electrode via the passivation through holes.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Hereinafter, embodiments of the invention will be further explained in detail with reference to the accompanying drawings.

Figure 1:
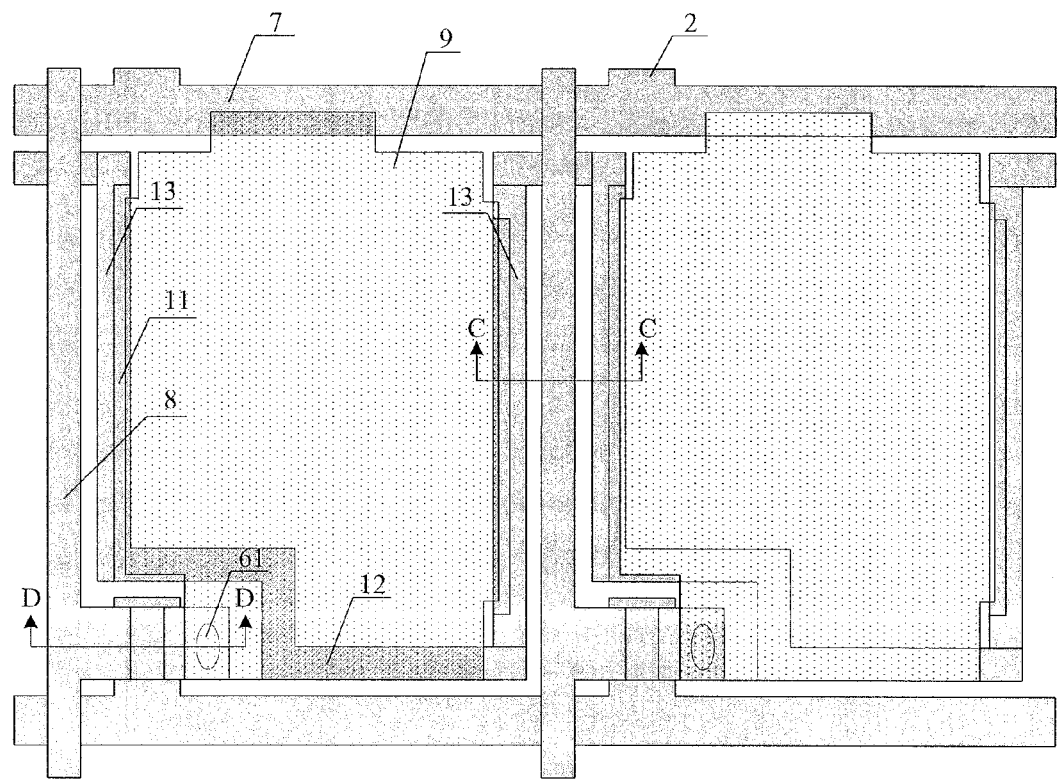
FIG. 1 is a plan view of a TFT-LCD array substrate according to a first embodiment of the invention.
Figure 2:
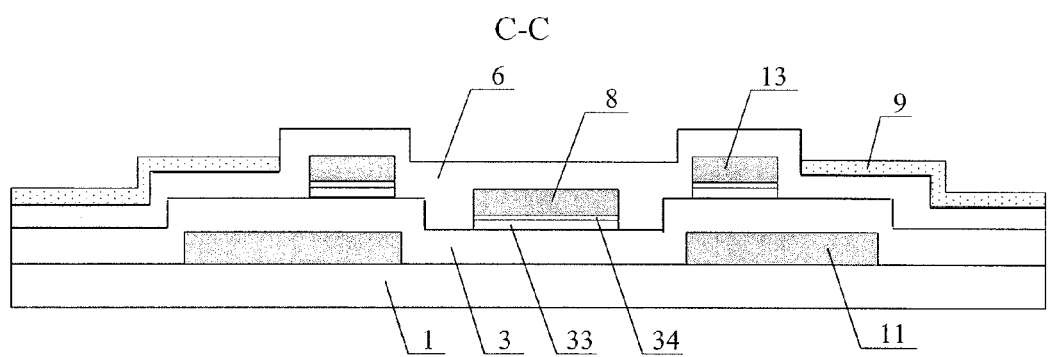
FIG. 2 is a cross-sectional view taken along line C-C of FIG. 1.
Figure 3:
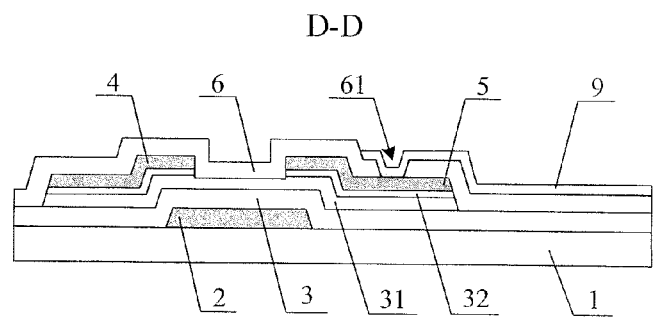
FIG. 3 is a cross-sectional view taken along line D-D of FIG. 1.

FIG. 1 is a plan view of a TFT-LCD array substrate according to a first embodiment of the invention, FIG. 2 is a cross-sectional view taken along line C-C of FIG. 1, and FIG. 3 is a cross-sectional view taken along line D-D of FIG. 1.

As shown in FIGS. 1, 2 and 3, the main configuration of the TFT-LCD array substrate according to an embodiment of the invention includes a plurality of gate lines 7 and a plurality of data lines 8 formed on a substrate 1. The gate lines 7 and the data lines 8 cross each other and define a plurality of pixel regions, and a pixel electrode 9 and a thin film transistor are formed within each of the pixel regions. The gate lines 7 are used to provide gate signals (such as a "ON" signal) to the corresponding thin film transistors, the data lines 8 are used to provide data signals to the corresponding pixel electrodes 9. The thin film transistors and the pixel electrodes 9 are arranged in an array such that a plurality of pixel rows and a plurality of pixel columns are formed. A first light blocking bar 11 is formed in each pixel region and disposed around the edge of the pixel electrode 9 in the pixel region, and a second light blocking bar 13 is formed over the first light blocking bar 11. Since the second light blocking bar 13 is positioned over the first light blocking bar 11, a wall (or a wall-like structure) can be formed between the pixel electrode 9 and the data line 8 so that interference effect of the parasitic capacitance can be reduced. Also, the height of the light blocking structure is elevated, and thus, light leakage between the original first light blocking bar and the data line may be effectively blocked.

More specifically, the gate line 7, the data line 8, the pixel electrode 9 and the thin film transistor are formed for each of the pixel regions on the array substrate according to the present embodiment. The thin film transistor sequentially from the substrate 1 side includes a gate electrode 2, a gate insulation layer 3, a semiconductor layer 31, a doped semiconductor layer 32, a source electrode 4 and a drain electrode 5, and a passivation layer 6. When the gate line 7 and the gate electrode 2 are formed, two first light blocking bars 11 are formed at the left side and right side of the pixel electrode 9, respectively, and the first light blocking bar 11 on the right side of the left pixel electrode 9 of the two adjacent pixel electrodes 9 in horizontal direction is connected with the first light blocking bar 11 on the left side of the right pixel electrode 9. A common electrode 12 and the first light blocking bar 11 can be connected into an integral structure, and the common electrode 12 is parallel with the gate line 7. An island-like active layer is formed on the gate insulation layer 3 and positioned above the gate electrode 2, and the island-like active layer includes a stack of the semiconductor layer 31 and the doped semiconductor layer 32; one end of the source electrode 4 is positioned above the gate electrode 2 and the other end thereof is connected with the data line 8; one end of the drain electrode 5 is positioned above the gate electrode 2 and the other end thereof is connected with the pixel electrode 9 via a through hole 61 formed in the passivation layer 6; and a thin film transistor (TFT) channel region is formed between the source electrode 4 and the drain electrode 5. In the TFT channel region, the doped semiconductor layer 32 is etched away and thus the portion of the underlying semiconductor layer 31 is exposed. The second light blocking bar 13 is positioned over the first light blocking bar 11, and under the second light blocking bar 13 there is also retained a stack of a semiconductor thin film 33 and a doped semiconductor thin film 34. Then, the passivation layer 6 and the pixel electrode 9 are formed on the structure as described above.

The first light blocking bar 11, the gate electrode 2, the gate line 7 and the common electrode 12 may be on the same layer and formed in the same one patterning process; the second light blocking bar 13 may be on the same layer as the source electrode 14, the drain electrode 5 and the data line 8, and they may be formed in the same one patterning process. For example, when the array substrate is formed by using a four-mask process as described later, the semiconductor thin film 33 and the doped semiconductor thin film 34 are retained between the first light blocking bar 11 and the second light blocking bar 13 and on the gate insulation layer 3 and this stack is formed in the same layer as the active layer above the gate electrode 2.

Furthermore, the second light blocking bar 13 can be connected with the common electrode 12 or applied with a voltage that is the same as that of the common electrode 12. Thus, a wall can be formed between the data line 8 and the pixel electrode 9, and interference effect of the parasitic capacitance formed between the data line 8 and the pixel electrode 9 via the passivation layer 6 can be reduced, and thereby, "image sticking" can be reduced. The height of the light blocking structure is elevated because the second light blocking bar 13 is formed, and thus, light leakage can be more effectively blocked and image quality may be improved.

Figure 4:
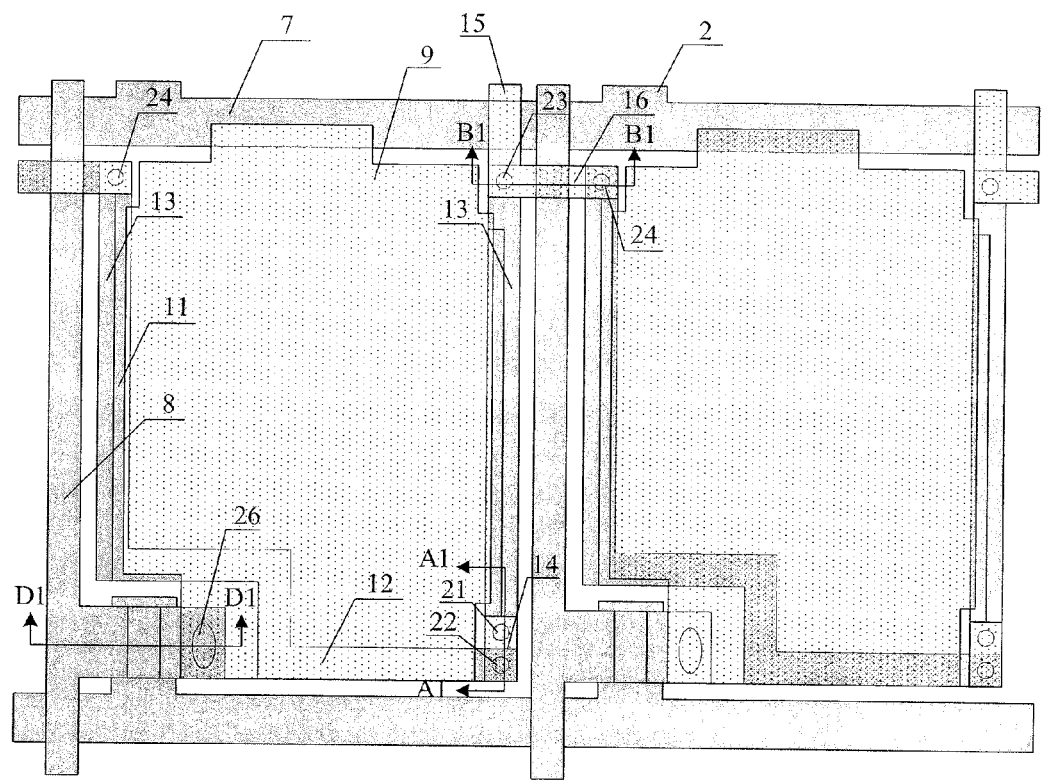
FIG. 4 is a plan view of a TFT-LCD array substrate according to a second embodiment of the invention.
Figure 5:
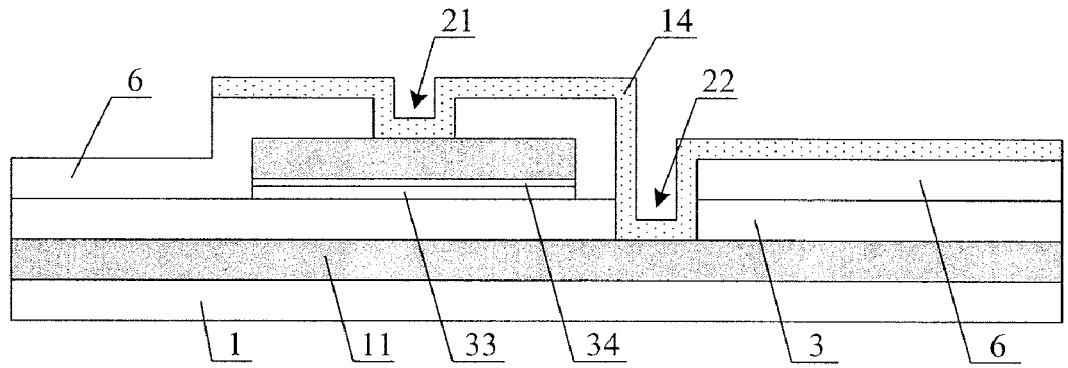
FIG. 5 is a cross-sectional view taken along line A1-A1 of FIG. 4.
Figure 6:
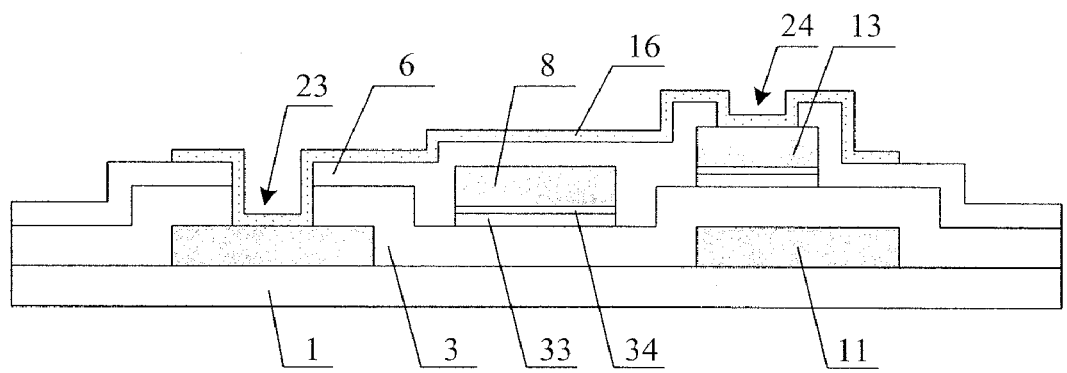
FIG. 6 is a cross-sectional view taken along line B1-B1 of FIG. 4.
Figure 7:
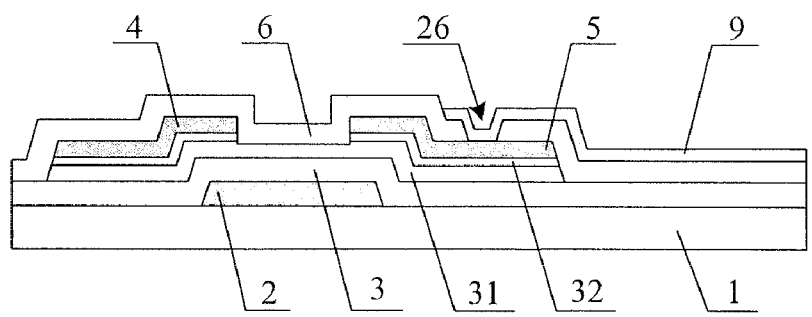
FIG. 7 is a cross-sectional view taken along line D1-D1 of FIG. 4.

FIG. 4 is a plan view of a TFT-LCD array substrate according to a second embodiment of the invention, FIG. 5 is a cross-sectional view taken along line A1-A1 of FIG. 4, FIG. 6 is a cross-sectional view taken along line B1-B1 of FIG. 4, and FIG. 7 is a cross-sectional view taken along line D1-D1 of FIG. 4.

As shown in FIG. 4 through FIG. 7, a gate line 7, a data line 8, a pixel electrode 9 and a thin film transistor are formed for each of the pixel regions on the array substrate of the present embodiment. The thin film transistor sequentially includes a gate electrode 2, a gate insulation layer 3, a semiconductor layer 31, a doped semiconductor layer 32, a source electrode 4 and a drain electrode 5, and a passivation layer 6. When the gate line 7 and the gate electrode 2 are formed, two first light blocking bars 11 are formed at the left side and right side of the pixel electrode 9, respectively, and the first light blocking bar 11 on the right side of the left pixel electrode 9 of the two adjacent pixel electrodes in the horizontal direction is connected with the first light blocking bar 11 on the left side of the right pixel electrode 9. A common electrode 12 and the first light blocking bar 11 can be connected into an integral structure, and the common electrode 12 is parallel with the gate line 7. An island-like active layer is formed on the gate insulation layer 3 and positioned above the gate electrode 2, and the island-like active layer includes a stack of the semiconductor layer 31 and the doped semiconductor layer 32. A stack of the semiconductor thin film 33 and the doped semiconductor thin film 34 are also retained on the gate insulation layer 3 and positioned over the first light blocking bar 11, and are formed in the same layer as the active layer above the gate electrode 2. One end of the source electrode 4 is positioned above the gate electrode 2 and the other end thereof is connected with the data line 8. One end of the drain electrode 5 is positioned above the gate electrode 2 and the other end thereof is connected with the pixel electrode 9 via a through hole 61 formed in the passivation layer 6. A TFT channel region is formed between the source electrode 4 and the drain electrode 5, and the doped semiconductor layer 32 within the channel region is etched away and thus the underlying semiconductor layer 31 is exposed. A second light blocking bar 13 is further formed on the stack of the semiconductor thin film 33 and the doped semiconductor thin film 34 over the first light blocking bar 11. Then, the passivation layer 6 and the pixel electrode 9 are formed on the structure as described above.

The first light blocking bar 11, the gate electrode 2, the gate line 7 and the common electrode 12 may be formed on the same layer and in the same one patterning process; the second light blocking bar 13 may be on the same layer as the source electrode 14, the drain electrode 5 and the data line 8, and these layers may be formed in the same one patterning process.

The first light blocking bar 11 may be connected with the second light blocking bar 13 by a connection stripe so that the second light blocking bar 13 also is connected to the common electrode 12. The first light blocking bar 11 and the second light blocking bar 13 of the same pixel region can be connected by a first connection stripe 14. Two first light blocking bars 11 in two adjacent pixel regions in the vertical direction are connected by a second connection stripe 15. The first light blocking bar 11 and the second light blocking bar 13 in two adjacent pixel regions in the horizontal direction are connected by a third connection stripe 16.

Specifically, on one side of a pixel region, a first through hole 21 is formed in the passivation layer 6 at a first end of the second light blocking bar 13, a second through hole 22 is formed in the gate insulation layer 3 and the passivation layer 6 at a first end of the first light blocking bar 11 adjacent to the first through hole 21, and the first connection stripe 14 connects the first light blocking bar 11 with the second light blocking bar 13 via the first through hole 11 and the second through hole 22, as shown in FIG. 5. On one side of the pixel region, a third through hole 23 is formed in the gate insulation layer 3 and the passivation layer 6 at a second end of the first light blocking bar 11, the second connection stripe 15 connects two first light blocking bars 11 of two adjacent pixel regions in the vertical direction via the second through hole 22 and the third through hole 23, and as shown in FIG. 4. The third through hole 23 is connected with the second through hole 22 of the upper pixel region. On the other side of the pixel region, a fourth through hole 24 is formed in the passivation layer 6 at the second end of the second light blocking bar 13, and the third connection stripe 16 connects the first light blocking bar 11 and the second light blocking bar 13 of two adjacent pixel regions in the horizontal direction via the third through hole 23 and the fourth through hole 24, as shown in FIG. 6. The first connection stripe 14, the second connection stripe 15, the third connection stripe 16 and the pixel electrode 9 are formed in the same layer and in the same one patterning process. The width of the second light blocking bar 13 may be 40%~60% of the width of the first light blocking bar 11. The first end of the first light blocking bar 11 and the first end of the second light blocking bar 13 described above in the present embodiment are the end portions of the first light blocking bar 11 and the second light blocking bar 13 that are positioned at the right lower position of one pixel region as shown; the second end of the first light blocking bar 11 described above in the present embodiment is the end portion of the first light blocking bar 11 positioned at the right upper position of one pixel region a shown; and the second end of the second light blocking bar 13 described above in the present embodiment is the end portion of the second light blocking bar 13 positioned at the left upper position of one pixel region as shown in FIG. 4.

In the TFT-LCD array substrate according to the embodiment of the invention, a wall is formed between the data line 8 and the pixel electrode 9 by forming the second light blocking bar 13, and thus, interference of the parasitic capacitance formed between the data line 8 and the pixel electrode 9 via the passivation layer 6 is reduced, and thereby, "image sticking" is reduced. Also, the second light blocking bar 13 is formed such that the height of the light blocking structure is elevated, and thus, the light leakage can be more effectively blocked and the image quality is improved.

FIG. 8 through FIG. 17 are schematic views illustrating a process for manufacturing the TFT-LCD array substrate according to an embodiment of the invention. In the following description, a patterning process referred to may include coating of photoresist, masking, exposing and developing of photoresist, etching by using a photoresist pattern, removing photoresist, etc., and an example of the photoresist may be positive photoresist.

Figure 8:
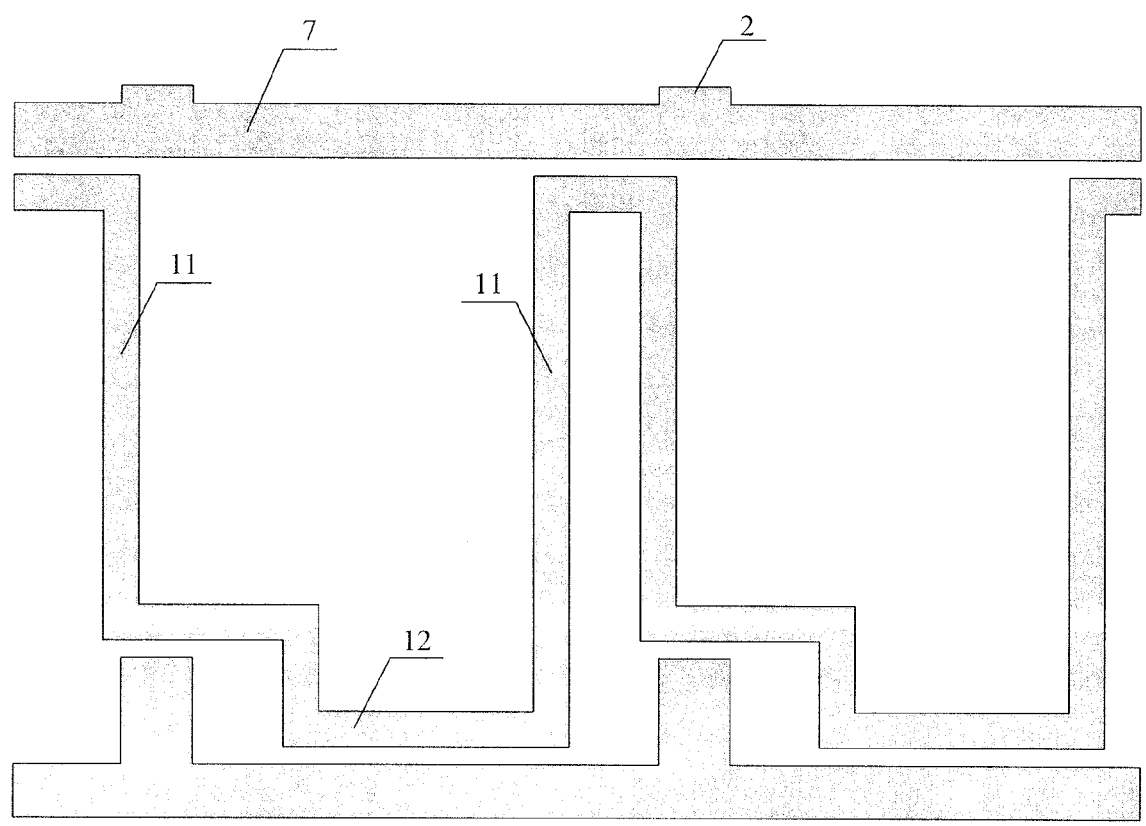
FIG. 8 is a plan view of a TFT-LCD array substrate according to the first embodiment of the invention after a first patterning process.

FIG. 8 is a plan view of a TFT-LCD array substrate according to a first embodiment of the invention after a first patterning process. Firstly, a gate metal thin film is deposited on a substrate 1 (such as a glass substrate or a quartz substrate) by using a magnetron sputtering method or a thermal evaporation method. The gate metal thin film may be a single layer or a composite layer structure of one of Al, Cr, W, Ta, Ti, Mo and AlNi or any combination thereof. The gate metal thin film is patterned by using a normal mask (also referred as a monotone mask), and a gate electrode 2, a gate line 7, a first light blocking bar 11 and a common electrode 12 are formed for each pixel region on the substrate 1, as shown in FIG. 8.

Figure 9:
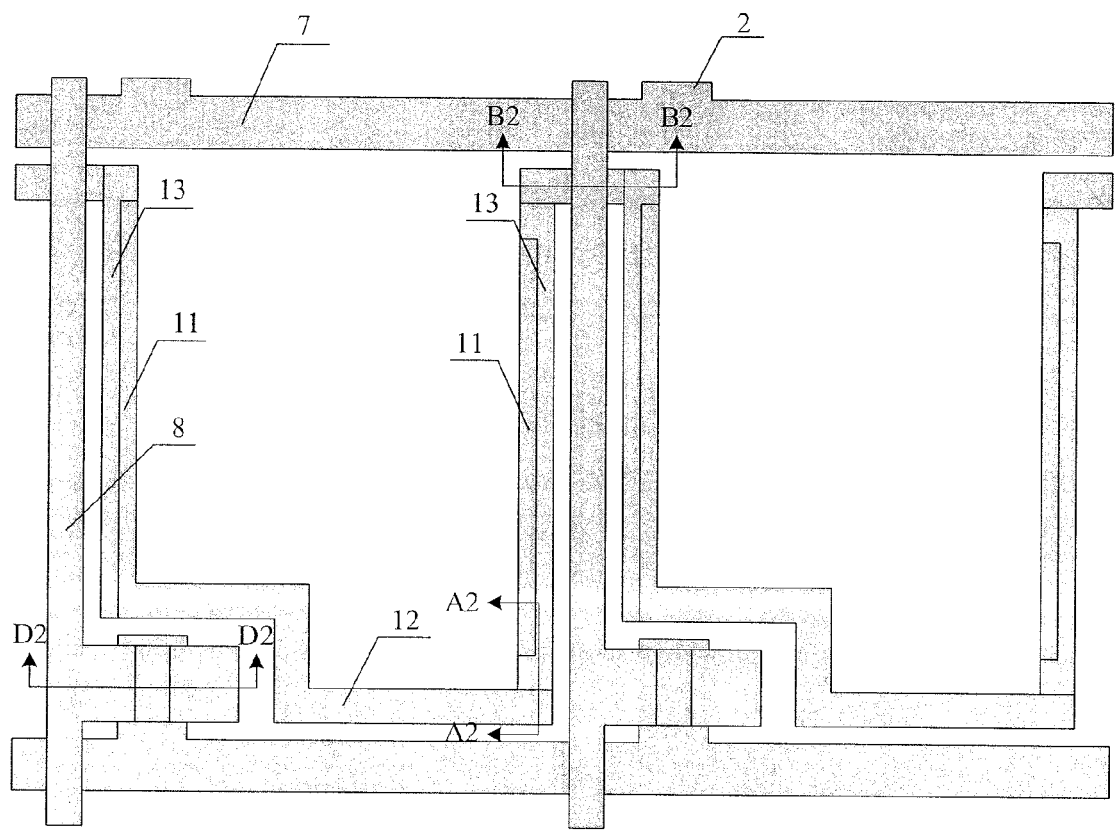
FIG. 9 is a plan view of a TFT-LCD array substrate according to the first embodiment of the invention after a second patterning process.
Figure 10:
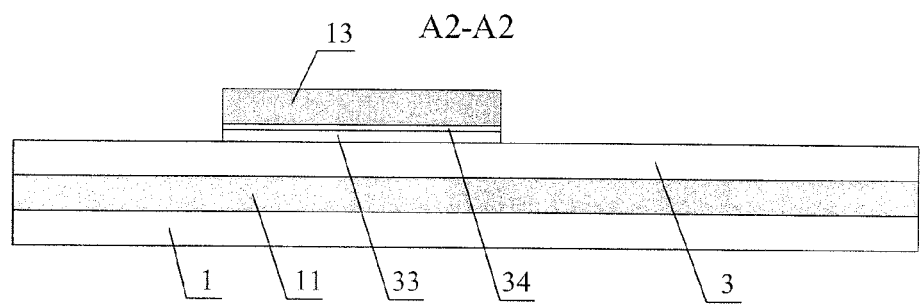
FIG. 10 is a cross-sectional view taken along line A2-A2 of FIG. 9.
Figure 11:
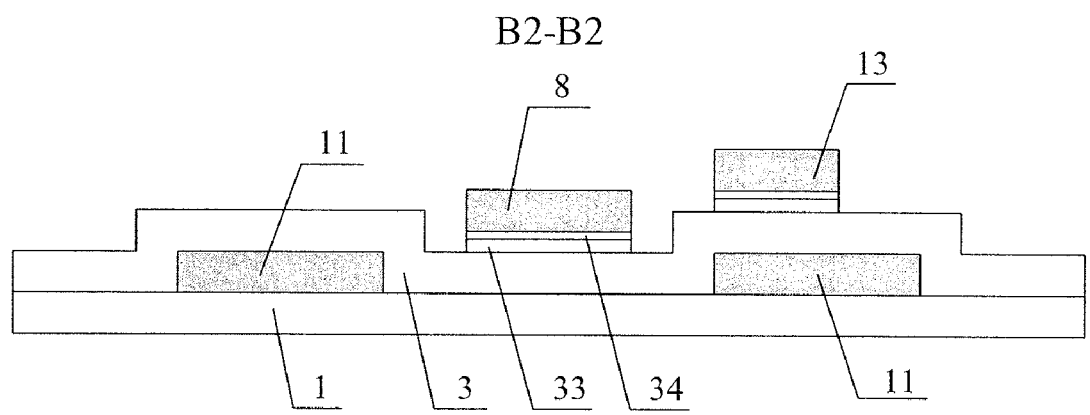
FIG. 11 is a cross-sectional view taken along line B2-B2 of FIG. 9.
Figure 12:
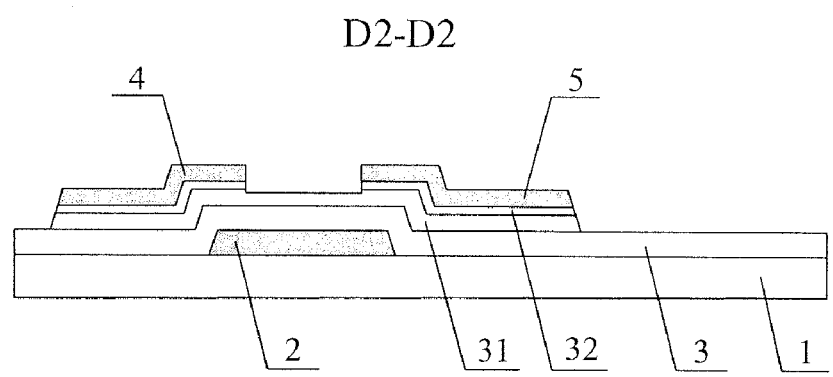
FIG. 12 is a cross-sectional view taken along line D2-D2 of FIG. 9.

FIG. 9 is a plan view of the TFT-LCD array substrate according to the first embodiment of the invention after a second patterning process, FIG. 10 is a cross-sectional view taken along line A2-A2 of FIG. 9, FIG. 11 is a cross-sectional view taken along line B2-B2 of FIG. 9, and FIG. 12 is a cross-sectional view taken along line D2-D2 of FIG. 9.

On the resultant substrate obtained by the above first patterning process, firstly a gate insulation layer 3, a semiconductor thin film 33 and a doped semiconductor thin film 34 are sequentially deposited by using a plasma enhanced chemical vapor deposition (PECVD); then, a source drain metal thin film is deposited by using a the magnetron sputtering method or the thermal evaporation method. A layer of photoresist is coated on the source drain metal thin film, and the photoresist is exposed by using a half-tone or gray-tone mask such that a completely-exposed region, a non-exposed region and a partially-exposed region are formed. The non-exposed region corresponds to the region where a data line 8, a source electrode 4, a drain electrode 5 and the second light blocking bar 13 for each pixel region are located, the partially-exposed region corresponds to the region where a TFT channel region between the source electrode 4 and the drain electrode 5 is located, and the completely-exposed region corresponds to the region except for the above regions. After the photoresist is developed, a thickness of the photoresist in the non-exposed region is not substantially changed, and thus a photoresist-completely-retained region is formed; the photoresist in the completely-exposed region is completely removed, and thus a photoresist-completely-removed-region is formed; and a thickness of the photoresist in the partially-exposed region becomes thinner, and thus a photoresist-partially-retained-region is formed.

Then, the source drain metal thin film, the semiconductor thin film 3 and the doped semiconductor thin film 4 in the completely-exposed region are etched away by a first etching process, and the island-like active layer, the date line 8, the source electrode 4, the drain electrode 5 and the second light blocking bar 13 are formed. Then, the photoresist in the partially-exposed region is removed by an ashing process, and the corresponding portion of the source drain metal thin film is exposed in this region. The source drain metal thin film and the doped semiconductor film in the partially-exposed region are etched away by a second etching process, a portion of the thickness of the semiconductor thin film is also etched and the semiconductor film is exposed, and thus, the TFT channel region is formed between the source electrode 4 and the drain electrode 5 and the island-like active layer comprising a stack of the patterned semiconductor layer and doped semiconductor layer is formed. Finally, the remaining photoresist is removed, and thus, the second patterning process of the TFT-LCD array substrate of an embodiment of the invention is completed. After the second patterning process, one end of the source electrode 4 is located above the gate electrode 2, and the other end thereof is connected with the data line 8; one end of the drain electrode 5 is located above the gate electrode 2 and disposed to face the source electrode 4, and the doped semiconductor layer in the TFT channel region between the source electrode 4 and the drain electrode 5 is etched away and the underlying semiconductor layer 31 is exposed. In addition, the semiconductor thin film 33 and the doped semiconductor thin film 34 is also retained below the data line 8 and the second light blocking bar 13.

Figure 13:
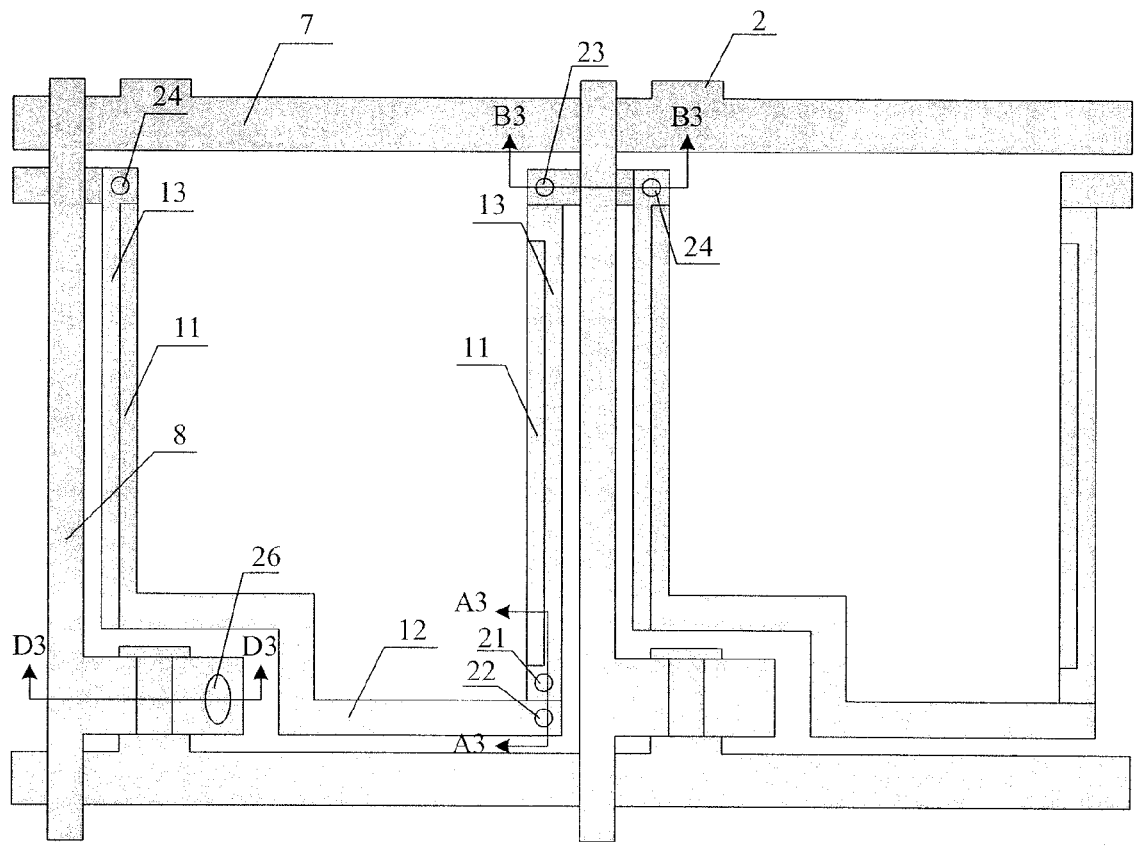
FIG. 13 is a plan view of a TFT-LCD array substrate according to the first embodiment of the invention after a third patterning process.
Figure 14:
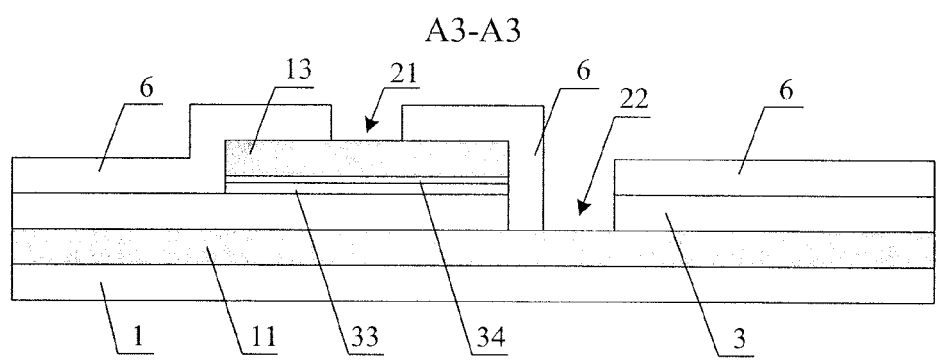
FIG. 14 is a cross-sectional view taken along line A3-A3 of FIG. 13.
Figure 15:
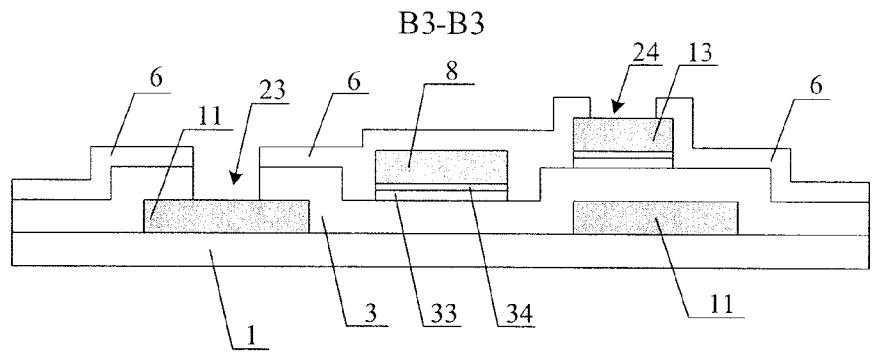
FIG. 15 is a cross-sectional view taken along line B3-B3 of FIG. 13.
Figure 16:
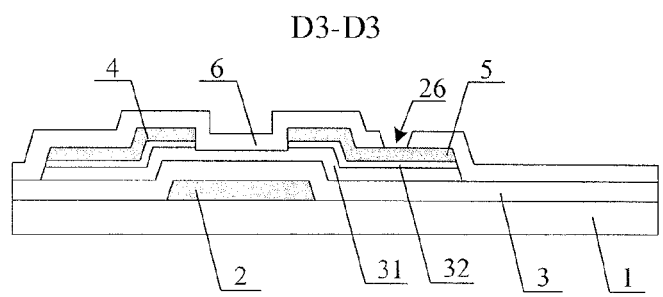
FIG. 16 is a cross-sectional view taken along line D3-D3 of FIG. 13.

FIG. 13 is a plan view of the TFT-LCD array substrate according to a first embodiment of the invention after a third patterning process, FIG. 14 is a cross-sectional view taken along line A3-A3 of FIG. 13, FIG. 15 is a cross-sectional view taken along line B3-B3 of FIG. 13, and FIG. 16 is a cross-sectional view taken along line D3-D3 of FIG. 13.

On the resultant substrate obtained by the above second patterning process, a passivation layer 6 is deposited by using a PECVD method. The passivation layer 6 is patterned by using a normal mask, and a first through hole 21, a second through hole 22, a third through hole 23, a fourth through hole 24 and a sixth through hole 26 are formed in each of the pixel regions, as shown in FIG. 13 through FIG. 16. On one side (such as the right side) of the pixel region, the first through hole 21 is formed in the passivation layer 6 on one end of the second light blocking bar 13; the second through hole 22 is formed in the gate insulation layer 3 and the passivation layer 6 on one end of the first light blocking bar 11 adjacent to the first through hole 21. On one side (such as the right side) of the pixel region, a third through hole 23 is formed in the gate insulation layer and the passivation layer on the other end of the first light blocking bar 11; on the other side (such as the left side) of the pixel region, a fourth through hole 24 is formed in the passivation layer 6 at the other end of the second light blocking bar 13.

Finally, on the substrate on which the above structures are formed, a transparent conductive thin film is deposited by using a magnetron sputtering method or a thermal evaporation method. The transparent conductive thin film is patterned by a normal mask such that a pixel electrode 9, a first connection stripe 14, a second connection stripe 15 and a third connection stripe 16 are formed in each of the pixel region, as shown in FIG. 4 through FIG. 7. The pixel electrode 9 within each of the pixel region is connected with the drain electrode 25 via the sixth through hole 26, the first connection stripe 14 connects the first light blocking bar 11 with the second light blocking bar 13 via the first through hole 11 and the second through hole 22, the second connection stripe 15 connects two first light blocking bar 11 of two adjacent pixel regions in the vertical direction via the second through hole 22 and the third through hole 23, and the third connection stripe 16 may connect the first light blocking bar 11 and the second light blocking bar 13 of two adjacent pixel regions in the horizontal direction via the third through hole 23 and the fourth through hole 24.

The four-mask process used in the present embodiment is only an example of the method for manufacturing a TFT-LCD array substrate according to an embodiment of the invention. An embodiment of the invention may be implemented by increasing or decreasing the number of the patterning processes and selecting a different material or material combinations. For example, the second patterning process of the embodiment of the invention may be performed by two individual patterning processes by using normal masks. That is, the island-like active layer may be formed by one patterning process by using a normal mask, and the data line, the source electrode, the drain electrode and the TFT channel region may be formed by the another patterning process by using a normal mask. In this way, the semiconductor thin film 33 and the doped semiconductor thin film 34 retained below the second light blocking bar 13 and the data line 8 as shown in FIG. 5 and FIG. 6 are not formed in the patterning processes any more.

With the TFT-LCD array substrate provided by the embodiment of the invention, a wall is formed between the data line 8 and the pixel electrode 9 by forming the second light blocking bar 13, and thus, interference of the parasitic capacitance formed between the data line 8 and the pixel electrode 9 via the passivation layer 6 is reduced, and thereby, "image sticking" can be reduced; also, the second light blocking bar 13 is formed such that the height of the light blocking structure is increased, and thus, light leakage may be more effectively blocking and image quality may be improved.

Figure 17:
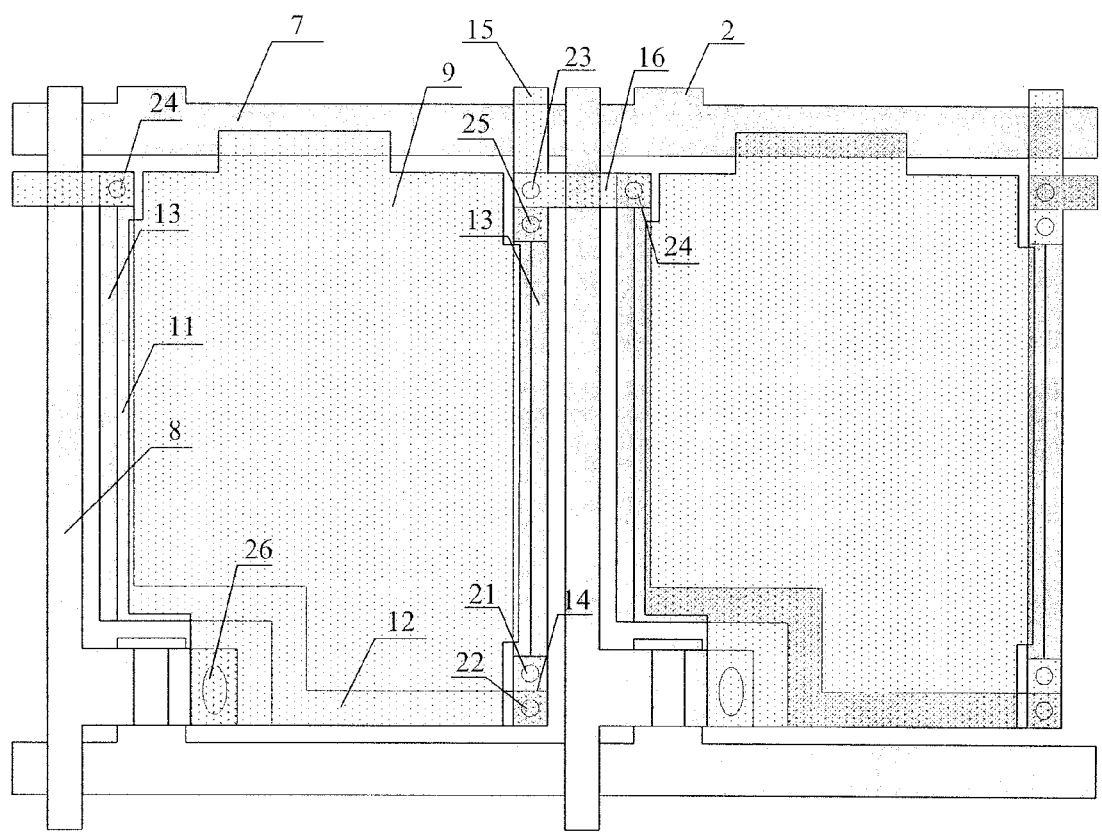
FIG. 17 is a plan view of a TFT-LCD array substrate according to a third embodiment of the invention.

FIG. 17 is a plan view of a TFT-LCD array substrate according to a third embodiment of the invention. The present embodiment is a variation of the second embodiment described above. Based on the second embodiment described above, the present embodiment further includes a fifth through hole 25, and the second connection stripe 15 connects two first light blocking bar 11 of two adjacent pixel regions in the vertical direction and connects the first light blocking bar 11 of two adjacent pixel regions in the vertical direction and the second light blocking bar 13 thereof via the second through hole 22, the third through hole 23 and the fifth through hole 25, such that two ends of the second light blocking bar 13 are both connected with the first light blocking bar 11 positioned below the second light blocking bar 13 such that the voltage applied to the second light blocking bar 13 is more uniform.

A method for manufacturing a thin film transistor liquid crystal display (TFT-LCD) array substrate according to the first embodiment of the invention may include the following steps.

Step 101. A gate metal thin film is deposited on a substrate, and a gate line, a gate electrode, a common electrode and a first light blocking bar are formed by a patterning process. The common electrode and the first light blocking bar are connected with each other into an integral structure.

Step 102. A gate insulation layer, a semiconductor thin film, a doped semiconductor thin film and a source drain metal thin film are deposited on the resultant substrate obtained after step 101, an island-like active layer, a data line, a drain electrode, a source electrode, a TFT channel region and a second light blocking bar are formed by a patterning process. The second light blocking bar is disposed over the first light blocking bar.

Step 103. A passivation layer is deposited on the resultant substrate obtained after step 102, and a plurality of through holes are formed by a patterning process.

Step 104. A transparent conductive thin film is deposited on the resultant substrate obtained after step 103, and a pixel electrode and a plurality of connection stripes are formed by a patterning process. The pixel electrode is connected with the drain electrode via one of the plurality of through holes, and the connection stripes further connects the first light blocking bar and the second light blocking bar via other through holes.

In the method for manufacturing the TFT-LCD array substrate of the present embodiment, a wall is formed between the data line and the pixel electrode by forming the second light blocking bar, and thus, interference of the parasitic capacitance formed between the data line and the pixel electrode by the passivation layer is reduced, and thereby, "image sticking" is reduced; also, the second light blocking bar is formed such that the height of the light blocking structure is increased, and thus, light leakage may be more effectively blocking and image quality may be improved.

In another embodiment, in the step 101, the common electrode is not formed; and in further another embodiment, in the step 104, the connection strips are not formed.

Hereinafter, the method for manufacturing the TFT-LCD array substrate according to an embodiment of the invention will be further explained with reference to the following embodiment. A method for manufacturing a TFT-LCD array substrate according to a second embodiment of the invention may include the following steps.

Step 201. A gate metal thin film is deposited on a substrate, and a gate line, a gate electrode, a common electrode and a first light blocking bar are formed by a patterning process. The common electrode and the first light blocking bar are connected with each other into an integral structure.

Step 202. A gate insulation layer, a semiconductor thin film, a doped semiconductor thin film and a source drain metal thin film are deposited on the resultant substrate obtained after step 201, an island-like active layer, a data line, a drain electrode, a source electrode, a TFT channel region and a second light blocking bar are formed by a patterning process.

The active layer formed above the gate electrode includes a stack of a semiconductor layer and a doped semiconductor layer, which are formed by patterning the semiconductor thin film and the doped semiconductor thin film, respectively. In a four-mask process, the semiconductor thin film and the doped semiconductor thin film are further retained below the data line and the second light blocking bar. The second light blocking bar is positioned over the first light blocking bar.

Step 203. A passivation layer is deposited on the resultant substrate obtained after step 202, and a plurality of through holes are formed by a patterning process.

Step 204. A transparent conductive thin film is deposited on the resultant substrate obtained after step 203, and a pixel electrode and a plurality of connection stripes are formed by a patterning process. The pixel electrode is connected with the drain electrode via one of the plurality of through holes, and the connection stripes connect the first light blocking bar and the second light blocking bar via other through holes.

An example of the step 203 may comprise the following sub-steps. On one side of a pixel region, a first through hole is formed in the passivation layer on a first end of the second light blocking bar, and a second through hole is formed in the gate insulation layer and the passivation layer on a first end of the first light blocking bar adjacent to the first through hole; on one side of the pixel region, a third through hole is formed in the gate insulation layer and the passivation layer on a second end of the first light blocking bar; on the other side of the pixel region, a fourth through hole is formed in the passivation layer on a second end of the second light blocking bar; on one side of the pixel region, a fifth through hole is formed in the passivation layer on the second end of the second light blocking bar; and a sixth through hole is formed above the drain electrode.

An example of the step 204 may comprise the following sub-steps. The pixel electrode and the first connection stripe are formed by a patterning process, and the first connection stripe connects the first light blocking bar and the second light blocking bar via the first through hole and the second through hole; a second connection stripe is formed by another patterning process, and the second connection stripe connects the first light blocking bars of two adjacent pixel regions in the vertical direction via the second through hole and the third through hole, and the second connection stripe may further also pass through the fifth through hole; a third connection stripe is formed by a patterning process, the third connection stripe connects the first light blocking bar and the second light blocking bar of two adjacent pixel regions in the horizontal direction via the third through hole and the fourth through hole; and the pixel electrode is connected with the drain electrode by the sixth through hole.

In the present embodiment, the first connection stripe, the second connection stripe and the third connection stripe are used to connect the first light blocking bar and the second light blocking bar, and the first connection stripe, the second connection stripe and the third connection stripe are formed in the same layer as the connection stripes for connecting the through holes, and the manufacturing process thereof have been described in detail as shown in FIG. 4 through FIG. 16, and thus the repeated description is omitted.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor liquid crystal display (TFT-LCD) array substrate, comprising:
   a plurality of gate lines and a plurality of data lines formed on a substrate,
   wherein the gate lines and the data lines define a plurality of pixel regions, and
   wherein, in each of the pixel regions, a pixel electrode, a thin film transistor and a first light blocking bar are formed, a second light blocking bar is formed over the first light blocking bar, and the second light blocking bar is formed between the pixel electrode of the pixel region and the data line for the pixel region.

2. The TFT-LCD array substrate of claim 1, wherein
the first light blocking bar and the gate lines are formed in a same layer and formed in a same one patterning process; and
the second light blocking bar and the data lines are formed in a same layer and formed in a same one patterning process.

3. The TFT-LCD array substrate of claim 2, wherein
a semiconductor thin film and a doped semiconductor thin film are retained under the second light blocking bar and the data lines.

4. The TFT-LCD array substrate of claim 2, wherein
the first light blocking bar is connected with the second light blocking bar by a first connection stripe.

5. The TFT-LCD array substrate of claim 4, wherein
two first light blocking bars in two adjacent pixel regions in a vertical direction are connected by a second connection stripe, and
the first light blocking bar and the second light blocking bar respectively in two adjacent pixel regions in a horizontal direction are connected by a third connection stripe.

6. The TFT-LCD array substrate of claim 5, wherein
on one side of each of the pixel regions, a first through hole is formed in a passivation layer on a first end of the second light blocking bar, a second through hole is formed in a gate insulation layer and the passivation layer on a first end of the first light blocking bar adjacent to the first through hole, and the first connection stripe connects the first light blocking bar with the second light blocking bar via the first through hole and the second through hole.

7. The TFT-LCD array substrate of claim 5, wherein
on one side of each of the pixel regions, a third through hole is formed in a gate insulation layer and a passivation layer on a second end of the first light blocking bar, and the second connection stripe connects two first light blocking bars in two adjacent pixel regions in a vertical direction via the second through hole and the third through hole.

8. The TFT-LCD array substrate of claim 5, wherein
on the other side of each pixel region opposite to the first connection stripe that is positioned on one side of the pixel region, a fourth through hole is formed in a passivation layer on a second end of the second light blocking bar, and the third connection stripe connects the first light blocking bar with the second light blocking bar in two adjacent pixel regions in a horizontal direction via the third through hole and the fourth through hole.

9. The TFT-LCD array substrate of claim 5, wherein
the first connection stripe, the second connection stripe, the third connection stripe and the pixel electrode in each of the pixel regions are formed in a same layer and a same one patterning process.

10. The TFT-LCD array substrate of claim 1, further comprising a common electrode in each of the pixel regions, wherein the common electrode and the first light blocking bar are an integral structure connected with each other.

11. The TFT-LCD array substrate of claim 2, further comprising a common electrode in each of the pixel regions, wherein the common electrode and the first light blocking bar are an integral structure connected with each other.

12. The TFT-LCD array substrate of claim 1, wherein a width of the second light blocking bar is 40%~60% of a width of the first light blocking bar.

13. A method for manufacturing a thin film transistor liquid crystal display (TFT-LCD) array substrate comprising a plurality of pixel regions, the method comprising:
Step 1 of forming a gate metal thin film on a substrate and forming a gate line, a gate electrode, and a first light blocking bar are formed for each pixel region by patterning;
Step 2 of forming a gate insulation layer, a semiconductor thin film, a doped semiconductor thin film and a source drain metal thin film on the resultant substrate obtained after step 1, an island-like active layer, a data line, a drain electrode, a source electrode, a thin film transistor (TFT) channel region and a second light blocking bar are formed for the pixel region by patterning, wherein the second light blocking bar is disposed over the first light blocking bar, and the gate line and the data line define the respective pixel region;
Step 3 of forming a passivation layer on the resultant substrate obtained after step 2 and a passivation layer through hole are formed for the pixel region by patterning; and
Step 4 of forming a transparent conductive thin film on the resultant substrate obtained after step 3, and a pixel electrode is formed for the pixel region by patterning, wherein the pixel electrode is connected with the drain electrode via the passivation through holes,
wherein the second light blocking bar is formed between the pixel electrode of the pixel region and the data line.

14. The method of claim 13, wherein a width of the second light blocking bar is 40%~60% of a width of the first light blocking bar.

15. The method of claim 13, wherein
the step 3 further comprises, on one side of each pixel region, forming a first through hole in the passivation layer on a first end of the second light blocking bar, and a second through hole is formed in the gate insulation layer and the passivation layer on a first end of the first light blocking bar adjacent to the first through hole; and
the step 4 further comprises forming a first connection stripe along with the pixel electrode by patterning, wherein the first connection stripe connects the first light blocking bar and the second light blocking bar via the first through hole and the second through hole.

16. The method of claim 15, wherein
the step 3 further comprises, on the one side of each pixel region, forming a third through hole in the gate insulation layer and the passivation layer on a second end of the first light blocking bar; and
the step 4 further comprises forming a second connection stripe by a patterning process, wherein the second connection stripe connects two first light blocking bars in two adjacent pixel regions via the second through hole and the third through hole.

17. The method of claim 16, wherein
the step 3 further comprises, on the other side of each pixel region, forming a fourth through hole in the passivation layer on a second end of the second light blocking bar; and
the step 4 further comprises forming a third connection stripe by patterning, wherein the third connection stripe connects the first light blocking bar and the second light blocking bar in two adjacent pixel regions via the third through hole and the fourth through hole.

18. The method of claim 16, wherein
the step 3 further comprises, on the one side of the pixel region, forming a fifth through hole in the passivation layer on a second end of the second light blocking bar; and the second connection stripe also passes through the fifth through hole.

19. The method of claim 13, wherein the step 3 further comprises forming the passivation layer through hole above the drain electrode.

20. The method of claim 13, wherein in the step 1, in each of the pixel regions, a common electrode is further formed, and the common electrode and the first light blocking bar are connected an integrate structure.

* * * * *